(12) United States Patent
Takechi et al.

(10) Patent No.: US 8,600,543 B2
(45) Date of Patent: Dec. 3, 2013

(54) APPARATUS AND METHOD FOR CONTROLLING TEMPERATURE OF SEMICONDUCTOR WAFERS

(75) Inventors: Hiroaki Takechi, Hadano (JP); Norio Takahashi, Hiratsuka (JP); Wataru Kiyosawa, Hiratsuka (JP); Shigenao Maruyama, Miyagi (JP); Atsuki Komiya, Miyagi (JP)

(73) Assignees: Kelk Ltd., Hiratsuka-shi (JP); Tohoku University, Sendai-shi (JP)

(*) Notice: Subject to any disclaimer, the term of this patent is extended or adjusted under 35 U.S.C. 154(b) by 243 days.

(21) Appl. No.: 12/992,971

(22) PCT Filed: Nov. 9, 2009

(86) PCT No.: PCT/JP2009/069044
§ 371 (c)(1),
(2), (4) Date: Nov. 16, 2010

(87) PCT Pub. No.: WO2010/053173
PCT Pub. Date: May 14, 2010

(65) Prior Publication Data
US 2011/0066294 A1    Mar. 17, 2011

(30) Foreign Application Priority Data

Nov. 10, 2008 (JP) .................................. 2008-287812

(51) Int. Cl.
*G06F 19/00* (2011.01)

(52) U.S. Cl.
USPC ............................ 700/207; 700/121; 700/299

(58) Field of Classification Search
USPC .................................. 700/121, 205, 207, 299
See application file for complete search history.

(56) References Cited

U.S. PATENT DOCUMENTS

| 5,740,016 A | * | 4/1998 | Dhindsa ........................ 361/704 |
| 2007/0258186 A1 | * | 11/2007 | Matyushkin et al. ......... 361/234 |

FOREIGN PATENT DOCUMENTS

| JP | 11-184538 | 7/1999 |
| JP | 2000-180071 | 6/2000 |
| JP | 2000-508119 | 6/2000 |
| JP | 2001-255944 A1 | 9/2001 |
| JP | 2003-243371 A1 | 8/2003 |
| JP | 3452150 B2 | 9/2003 |

OTHER PUBLICATIONS

Mori Isakata, Machine translation Japan Publication No. JP 07-240486, Sep. 12, 1995.*
International Search Report for International Application No. PCT/JP2009/069044 dated Feb. 3, 2010.

* cited by examiner

*Primary Examiner* — Carlos Ortiz Rodriguez
(74) *Attorney, Agent, or Firm* — Kratz, Quintos & Hanson, LLP

(57) ABSTRACT

When a temperature of a semiconductor wafer is controlled to be a target temperature by raising the temperature of the semiconductor wafer, switching is performed so that a high-temperature circulating liquid at a temperature higher than the target temperature in a high-temperature tank is supplied into an inside-stage flow channel, and respective thermoelectric elements in a plurality of zones in a stage are controlled; and then, the temperature of the semiconductor wafer matches the target temperature and a desired in-plane temperature distribution of the semiconductor wafer is provided.

10 Claims, 6 Drawing Sheets

FIG.6A
FIG.6B
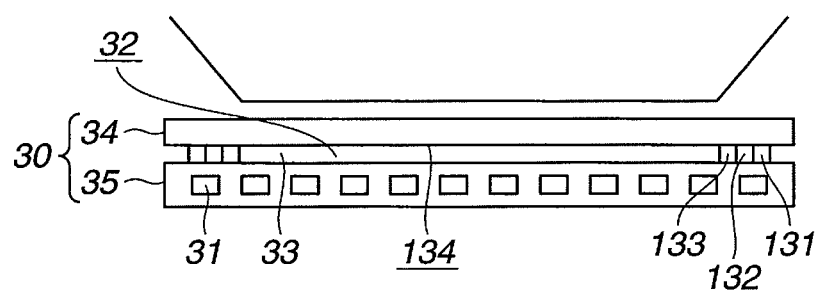
FIG.6C
FIG.6D
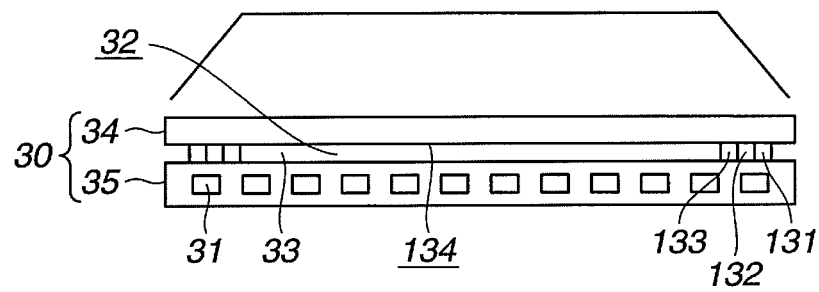

APPARATUS AND METHOD FOR CONTROLLING TEMPERATURE OF SEMICONDUCTOR WAFERS

TECHNICAL FIELD

The present invention relates to an apparatus and a method for controlling a temperature of a semiconductor wafer mounted on a stage, and more particularly, to the apparatus and the method suitable for use, especially, in a dry process or the like, when a temperature of the semiconductor wafer is controlled so as to reach a target temperature and when an in-plane temperature distribution of the semiconductor wafer is controlled so as to reach a desired temperature distribution.

BACKGROUND ART

Process for treating a semiconductor wafer such as a silicon wafer includes a step of controlling a temperature of a silicon wafer to a target temperature while controlling the in-plane temperature distribution of the silicon wafer (or deposit on the silicon wafer) to a desired temperature distribution. During a dry process, for example, it is required to uniformly etch with plasma a surface of a silicon wafer (or deposit layer on the silicon wafer) within a vacuum chamber. For this purpose, a control must be performed so that the temperature of the silicon wafer is uniformly distributed in the plane. There may be a case, however, in which reaction products are reattached to an etching surface during etching process to cause a decrease in an etching rate. Reaction products are likely distributed in a greater amount in an inner peripheral region than in an outer peripheral region. Therefore, although the temperature of the silicon wafer during the plasma etching is controlled so that the temperature is uniformly distributed in the plane, the temperature distribution is requested to be adjusted to vary the temperature in the plane between the outer circumference region and the inner circumference region of a silicon wafer, thereby to compensate for the distribution of the reaction products according to the generation of the reaction products. In other words, the in-plane temperature distribution of the silicon wafer is requested to be precisely adjusted to cancel disturbance. In terms of improving quality of semiconductor devices, it is requested to make the in-plane temperature distribution of the silicon wafer precisely a desired temperature distribution (uniformizing the in-plane temperature distribution and varying the in-plane temperature distribution by region).

Also, at present, in order to etch films made of different materials on a silicon wafer, etching is performed in a chamber which is controlled to be at different temperatures. In order to perform the etching of different films in the same chamber, it is necessary to control the base temperature of the whole silicon wafer to increase up to a target temperature or decrease down to a target temperature for each of the films.

Therefore, during the execution of such a process, it is requested to raise or drop the base temperature of a silicon wafer to a target temperature at a high speed, for the purpose of shortening the manufacturing time of semiconductor devices.

Conventional techniques concerning an apparatus for controlling temperature of a semiconductor wafer such as a silicon wafer mounted on a stage are as follows.

(Conventional Technique Disclosed in Patent Document 1)

Patent document 1 describes an invention in which thermoelectric elements provided in a stage are activated to uniformize the in-plane temperature distribution of a silicon wafer mounted on the stage and to vary the in-plane temperature between the inner circumference region and the outer circumference region.

(Convention Technique Disclosed in Patent Document 2)

Patent document 2 describes an invention in which circulating liquid of different temperatures is supplied in each of flow channels in the stage to uniformize the in-plane temperature distribution of a silicon wafer mounted on the stage and to vary the in-plane temperature distribution between the inner circumference region and the outer circumference region.

(Convention Technique Disclosed in Patent Document 3)

Patent document 3 describes an invention in which low-temperature circulating liquid or high-temperature circulating liquid is selectively supplied in flow channels in a stage so that a base temperature of a silicon wafer is controlled to be a target low temperature or target high temperature.

(Conventionally Executed Techniques)

A heater for heating service and a flow channel are provided in a stage while a low-temperature tank for storing a heat-absorbing circulating liquid is supplied outside the stage. A control is performed so that a low-temperature circulating liquid is supplied in the flow channel from the low-temperature tank while electric power is supplied to the heater when a silicon wafer on the stage is heated, and the low-temperature circulating liquid is supplied in the flow channel from the low-temperature tank while electric power to be supplied to the heater is turned off when the silicon wafer on the stage is cooled.

Conventional Art Documents

Patent Document

Patent document 1: Japanese Patent Application Laid-open (Translation of PCT Application) No. 2000-508119

Patent document 2: Japanese Patent Application Laid-open No. 2003-243371

Patent document 3: Japanese Patent Application Laid-open No. 07-240486

BRIEF DESCRIPTION OF THE DRAWINGS

FIG. 4A and 4B are sectional views illustrating thermoelectric elements and heaters embedded in a stage, while

FIG. 5 illustrates an example of the apparatus in which the stage is divided into four zones, wherein FIGS. 6A, 6B, 6C and 6D are drawings to explain a control for making in-plane temperature distribution of a silicon wafer a desired temperature distribution.

DISCLOSURE OF THE INVENTION

Figure 1:
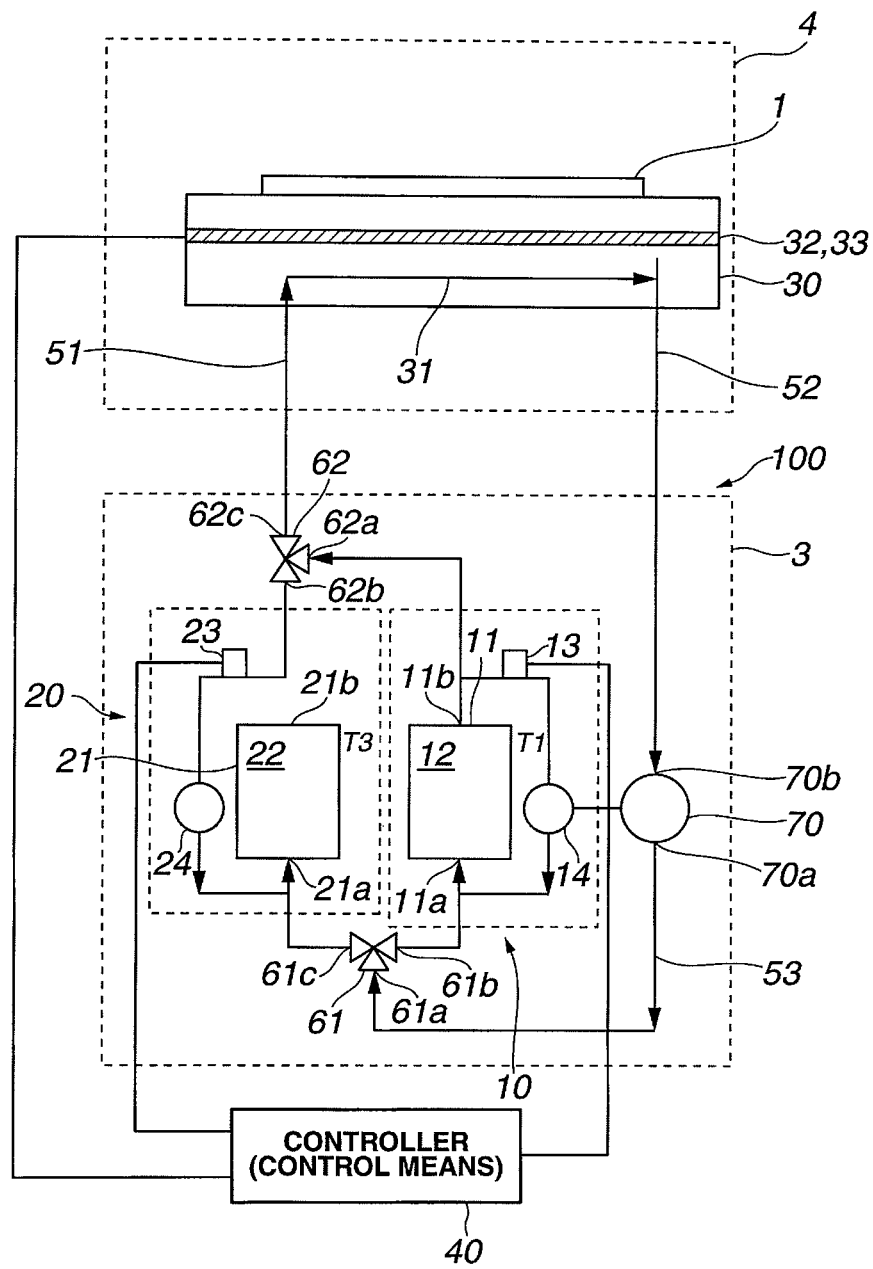
FIG. 1 illustrates the temperature control apparatus according to an exemplary embodiment of this invention.

Problems to be Solved by the Invention

According to the invention disclosed in the patent document 1, it is at least possible to control so as to uniformize the in-plane temperature distribution of a silicon wafer mounted on the stage, and to vary the temperatures in the plane between an inner circumference region and an outer circumference region. However, it is not possible to raise or drop the base temperature of a silicon wafer to a target temperature at a high speed only by thermoelectric elements provided in the stage.

Similarly, according to the invention disclosed in the patent document 2, it is at least possible to control so as to uniformize the in-plane temperature distribution of a silicon wafer mounted on the stage, and to vary the in-plane temperature distribution between the inner circumference region and the outer circumference region. However, it is not possible to make the in-plane temperature distribution of the silicon wafer precisely a desired temperature distribution only by supplying circulating liquid of different temperature in each of flow channels in the stage. Additionally, it is not possible to raise or drop the base temperature of a silicon wafer to a target temperature at a high speed.

Additionally, according to the invention disclosed in the patent document 3, it is at least possible to control so as to make the base temperature of a silicon wafer a target low temperature or target high temperature. However, it is not possible to adjust so as to make any target temperature at a high speed.

According to the aforementioned conventionally executed techniques, it is possible at least to control so as to make the base temperature of a silicon wafer a target low temperature or a target high temperature. However, it is not possible to change into any target temperature at a high speed through the combination of heating by a heater and a low-temperature circulating liquid. Also, it is not possible to make precisely the in-plane temperature distribution of a silicon wafer a desired temperature distribution. Furthermore, since heating is performed by a heater while a low-temperature circulating liquid is being supplied to a flow channel, it is necessary to enlarge the capacities of the heater and a chiller, which result in a high apparatus cost and poor energy efficiency due to wasteful consumption of heat energy.

The present invention has been made in view of the above circumstances, and its object to solve the problems is that a manufacturing time of a semiconductor device is shortened by raising and dropping the base temperature of semiconductor wafers such as silicon wafer, to target temperatures at a high speed, a semiconductor device can be manufactured with high qualities by making the in-plane temperature distribution of the semiconductor wafer a desired temperature distribution with high accuracy (by uniformizing the in-plane temperature and varying the in-plane temperature distribution for each region), and furthermore, an apparatus with excellent energy efficiency can be simply configured.

Means to Solve the Problem

Accordingly, a first aspect of the present invention provides an apparatus for controlling a temperature of a semiconductor wafer that controls the temperature of the semiconductor wafer mounted on a stage to be a target temperature and controls an in-plane temperature distribution of the semiconductor wafer to be a desired temperature distribution, comprising: a low-temperature tank that stores a circulating liquid which is kept to be a low temperature lower than the target temperature; a high-temperature tank that stores a circulating liquid which is kept to be a high temperature higher than the target temperature; a plurality of zones which are formed at each region in the stage and whose temperatures are capable of being adjusted independently, the plurality of zones being each provided with a thermoelectric element; an inside-stage flow channel which is formed inside the stage and into which a circulating liquid flows; a switching unit that selectively switches between a low-temperature circulating liquid and a high-temperature circulating liquid to supply to the inside-stage flow channel; and, control means that, when the temperature of the semiconductor wafer is controlled to be the target temperature by raising the temperature of the semiconductor wafer, performs switching so that the high-temperature circulating liquid in the high-temperature tank is supplied into the inside-stage flow channel, and controls the thermoelectric element so that the temperature of the semiconductor wafer coincides with the target temperature and the in-plane temperature distribution of the semiconductor wafer becomes the desired temperature distribution, and when the temperature of the semiconductor wafer is controlled to be the target temperature by dropping the temperature of the semiconductor wafer, performs switching so that the low-temperature circulating liquid in the low-temperature tank is supplied into the inside-stage flow channel, and controls the thermoelectric element so that the temperature of the semiconductor wafer coincides with the target temperature and the in-plane temperature distribution of the semiconductor wafer becomes the desired temperature distribution.

A second aspect of the present invention provides the apparatus according to the first aspect of the present invention in which the plurality of zones are each provided with a heater, and the control means, when the temperature of the semiconductor wafer is controlled to be the target temperature by raising the temperature of the semiconductor wafer, performs switching so that the high-temperature circulating liquid in the high-temperature tank is supplied into the inside-stage flow channel, and controls the thermoelectric element and the heater so that the temperature of the semiconductor wafer coincides with the target temperature and the in-plane temperature distribution of the semiconductor wafer become the desired temperature distribution, and when the temperature of the semiconductor wafer is controlled to be the target temperature by dropping the temperature of the semiconductor wafer, performs switching so that the low-temperature circulating liquid in the low-temperature tank is supplied into the inside-stage flow channel, and controls the thermoelectric element and the heater so that the temperature of the semiconductor wafer coincides with the target temperature and the in-plane temperature distribution of the semiconductor wafer becomes the desired temperature distribution.

A third aspect of the present invention provides the apparatus according to the first or second aspect of the present invention in which, the plurality of zones are each provided with a temperature sensor, and temperatures of the zones are controlled on the basis of the temperature detected by the temperature sensor.

A fourth aspect of the present invention provides a method for controlling a temperature of a semiconductor wafer mounted on a stage that controls the temperature of the semiconductor wafer so as to reach a target temperature and controls an in-plane temperature distribution of the semiconductor wafer so as to reach a desired temperature distribution, comprising: performing switching so that a high-temperature circulating liquid is supplied into an inside-stage flow channel, and controlling a thermoelectric element so that the temperature of the semiconductor wafer coincides with the target temperature and the in-plane temperature distribution of the semiconductor wafer becomes the desired temperature distribution, when the temperature of the semiconductor wafer is controlled to be the target temperature by raising the temperature of the semiconductor wafer, and performing switching so that a low-temperature circulating liquid is supplied into the inside-stage flow channel, and controlling the thermoelectric element so that the temperature of the semiconductor wafer coincides with the target temperature and the in-plane temperature distribution of the semiconductor wafer becomes the desired temperature distribution, when the temperature of the semiconductor wafer is controlled to be the target temperature by dropping the temperature of the semiconductor wafer.

A fifth aspect of the present invention provides the method according to the fourth aspect of the present invention in which switching is performed so that the high-temperature circulating liquid is supplied into the inside-stage flow channel, and the thermoelectric element and the heater are controlled so that the temperature of the semiconductor wafer coincides with the target temperature and the in-plane temperature distribution of the semiconductor wafer becomes the desired temperature distribution, when the temperature of the semiconductor wafer is controlled to be the target temperature by raising the temperature of the semiconductor wafer, and switching is performed so that the low-temperature circulating liquid is supplied into the inside-stage flow channel, and the thermoelectric element and the heater are controlled so that the temperature of the semiconductor wafer coincides with the target temperature and the in-plane temperature distribution of the semiconductor wafer becomes the desired temperature distribution, when the temperature of the semiconductor wafer is controlled to be the target temperature by dropping the temperature of the semiconductor wafer.

A sixth aspect of the present invention provides the apparatus according to the first aspect of the present invention in which the plurality of zones are formed by four zones by dividing the semiconductor wafer with concentric circle lines.

A seventh aspect of the present invention provides the apparatus according to the sixth aspect of the present invention in which the control means causes the thermoelectric element in an outermost circumference zone of the four zones to operate to perform a heat generating action, and causes the thermoelectric element in a zone inwardly adjacent to the outermost circumference zone and the thermoelectric element in a zone further inwardly adjacent to the zone which is inwardly adjacent to the outermost circumference zone to operate to perform a heat absorbing action.

An eight aspect of the present invention provides the apparatus according to the sixth aspect of the present invention in which the control means causes the thermoelectric element in an outermost circumference zone of the four zones and the thermoelectric element in a zone inwardly adjacent to the outermost circumference zone to operate to perform a heat absorbing action, and causes the thermoelectric element in a zone further inwardly adjacent to the zone which is inwardly adjacent to the outermost circumference zone to operate to perform a heat generating action.

A ninth aspect of the present invention provides the method according to the fourth aspect of the present invention in which the plurality of zones are formed by four zones by dividing the semiconductor wafer with concentric circle lines.

A tenth aspect of the present invention provides the method according to the ninth aspect of the present invention in which the thermoelectric element in an outermost circumference zone of the four zones is caused to operate to perform a heat generating action, and the thermoelectric element in a zone inwardly adjacent to the outermost circumference zone and the thermoelectric element in a zone further inwardly adjacent to the zone which is inwardly adjacent to the outermost circumference zone are caused to operate to perform a heat absorbing action.

An eleventh aspect of the present invention provides the method according to the ninth aspect of the present invention in which the thermoelectric element in an outermost circumference zone of the four zones and the thermoelectric element in a zone inwardly adjacent to the outermost circumference zone are caused to operate to perform a heat absorbing action, and the thermoelectric element in a zone further inwardly adjacent to the zone which is inwardly adjacent to the outermost circumference zone is caused to operate to perform a heat generating action.

As stated above, in the first and the fourth aspects of the present invention, with the combined operations of heat generation and heat absorption by means of thermoelectric elements in addition to supplying a high-temperature circulating liquid and a low-temperature circulating liquid inside the stage, controls are performed so that the temperature of a semiconductor wafer coincides with a target temperature and the in-plane temperature distribution of the semiconductor wafer is a desired temperature distribution.

In the second and the fifth aspects of the present invention, with the combined operations of heat generation by means of thermoelectric elements (or heat generation and heat absorption by means of thermoelectric elements) and heating by a heater in addition to supplying a high-temperature circulating liquid and a low-temperature circulating liquid inside the stage, controls are performed so that the temperature of a semiconductor wafer coincides with a target temperature and the in-plane temperature distribution of the semiconductor wafer is a desired temperature distribution.

In the sixth through the eleventh aspects of the present invention, plural zones are formed by dividing a semiconductor wafer with concentric circle lines, and in-plane temperature of the semiconductor wafer is of a desired in-plane temperature distribution by independently controlling thermoelectric elements in these four zones.

Effect of the Invention

According to the present invention, by supplying a high-temperature circulating liquid and a low-temperature circulating liquid inside the stage to control the temperature of a semiconductor wafer, it is possible to raise or drop the base temperature of the semiconductor wafer at a high speed, thereby to shorten the manufacture time of the semiconductor wafer.

According to the present invention, with the combined operations of heat generation and heat absorption by means of thermoelectric elements (heating by a heater is further combined in the second and fifth inventions) in addition to supplying a high-temperature circulating liquid and a low-temperature circulating liquid inside the stage, controls are performed so that the temperature of a semiconductor wafer coincides with a target temperature and the in-plane temperature distribution of the semiconductor wafer is a desired temperature distribution, and hence, it becomes possible to finely adjust the temperature of each zone region of the stage into any temperature precisely and at a high speed. Therefore, it is possible to make the in-plane temperature distribution of a semiconductor wafer a desired temperature distribution (uniformizing the in-plane temperature distribution and varying the in-plane temperature distribution by region) accurately. As a result, it becomes possible to manufacture high-quality semiconductor devices.

Also, since heating and cooling are performed while the heating capacity and cooling capacity of thermoelectric elements (further heating capacity of a heater in the second and fifth inventions) are added to the heating capacity and cooling capacity of a chiller, it is possible to reduce the volume of a chiller and to simplify the construction of the apparatus.

Also, by dividing a semiconductor wafer with concentric circle lines into four zones and by independently controlling thermoelectric elements in these four zones, it is possible to make the in-plane temperature of the semiconductor wafer a desired in-plane temperature distribution very accurately.

Best Mode for Carrying Out the Invention

An exemplary embodiment of a temperature control apparatus according to the present invention will be described hereinafter with reference to the accompanying drawings.

FIG. 1 illustrates a configuration of a temperature control apparatus 100 according to an exemplary embodiment.

The temperature control apparatus 100 according to the exemplary embodiment is an apparatus for controlling a temperature of a silicon wafer 1 mounted on a stage 30 into a target temperature and also for controlling a temperature distribution within a plane of the silicon wafer 1 to be a desired temperature distribution. This temperature control apparatus 100 is to be used in, for example, a dry process.

The temperature control apparatus 100 is, broadly speaking, constituted by a stage 30 and a chiller apparatus 3.

Between the stage 30 and the chiller apparatus 3 are connected flow channels 51 and 52.

The stage 30 is disposed inside a vacuum chamber 4.

On the stage 30 is mounted a semiconductor wafer such as a silicon wafer 1. The silicon wafer 1 is held on the stage 30 by static electricity. However, helium gas may be flown between the stage 30 and the silicon wafer 1 for the purpose of increasing a heat transfer efficiency between the stage 30 and the silicon wafer 1.

During a dry process, vacuuming is performed for the vacuum chamber 4 to keep its inside at a predetermined low pressure.

Inside the stage are arranged plural thermoelectric elements 32 and heaters 33 in such a manner that the in-plane temperature distribution of the silicon wafer 1 mounted on the stage 30 is adjustable.

Figure 4A:
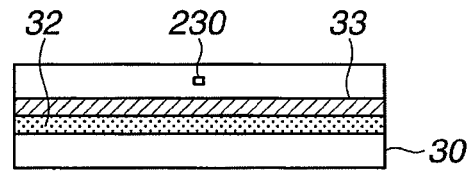
Figure 4B:
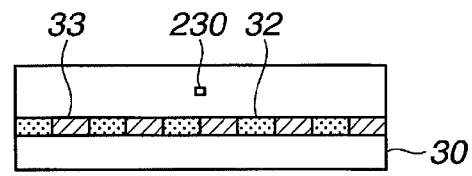

FIGS. 4A and 4B are sectional views of the stage 30, and illustrate two types of examples of the thermoelectric elements 32 and the heaters 33 in a section of the stage 30.

In FIG. 4A, above the thermoelectric elements 32 are arranged the heaters 33, above which a plate for mounting the silicon wafer 1 thereon is further arranged. A temperature sensor 230 is arranged within the plate.

In FIG. 4B, the thermoelectric elements 32 are arranged along circumferential directions of the stage 30, and also the heaters 33 are arranged along the circumferential directions. The thermoelectric elements 32 and the heaters 33 are arranged adjacent to each other along a radial direction of the stage 30. Above the thermoelectric elements 32 and the heaters 33 is arranged a plate on which the silicon wafer 1 is to be mounted. Inside the plate is arranged a temperature sensor 230.

In these two examples, plural zones whose temperatures are independently adjustable are formed in each region inside the stage 30. The thermoelectric elements 32, the heaters 33 and the temperature sensor 230 are arranged in each of the plural zones.

Figure 4C:
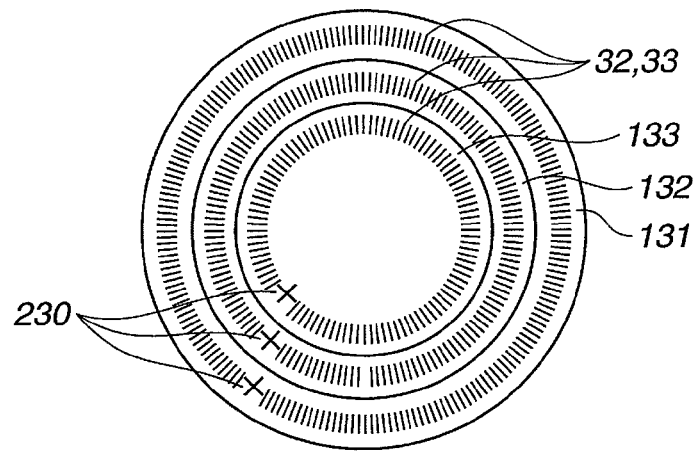
FIGS. 4C and 4D illustrate zone arrangement viewed from a top surface of the stage.
Figure 4D:
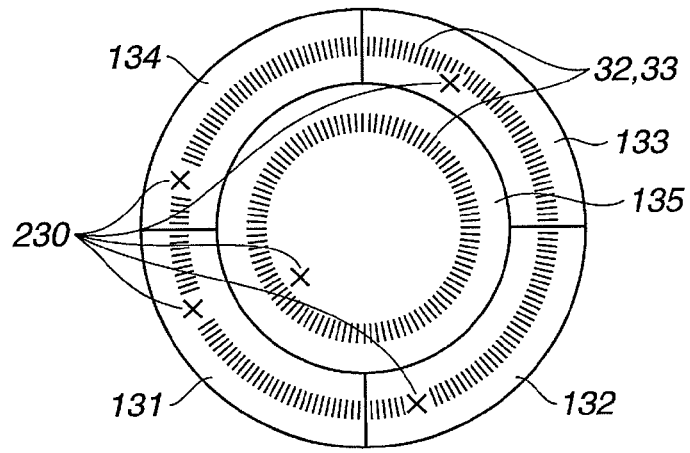

FIGS. 4C and 4D illustrate the stage 30 as viewed from the upper surface. FIG. 4C illustrates the stage 30 which is divided into three zones, and the thermoelectric elements 32, the heaters 33 and the temperature sensors 230 are arranged in each zone 131, 132 and 133. FIG. 4D illustrates the stage 30 which is divided into five zones, and the thermoelectric elements 32, the heaters 33 and the temperature sensors 230 are arranged in each zone 131, 132, 133, 134 and 135. Incidentally, in FIGS. 4C and 4D, illustration of the thermoelectric elements 32 other than in the shaded portions are omitted.

When electricity is applied to the thermoelectric elements 32, heat absorption action and heat generating action are performed in the stage surface corresponding to the thermoelectric elements 32 according to flowing direction of the electricity. In other words, each of the thermoelectric elements 32 can perform temperature adjustment for each zone of the stage 30 individually. Therefore, by adjusting the applied electricity to each of the thermoelectric elements 32 so as to control the heat absorption action and the heat generating action of each of the thermoelectric elements 32, a desired temperature gradient can be formed in the plane of the silicon wafer 1 mounted on the stage 30, and it is possible to make the in-plane temperature distribution of the silicon wafer 1a desired temperature distribution.

In each of the zones 131, 132, 133 and so on, the heaters 33 for heating are provided, and heating can also be performed by the heaters 33. To perform heating, it may be possible to operate the heaters 33 solely, or to operate the thermoelectric elements 32 so as to perform a heat generating action, in addition to operating of the heaters 33.

Now returning to FIG. 1 and description will be made in reference to FIG. 1.

Inside the stage 30 is formed an inside-stage flow channel 31 into which a below-described high-temperature circulating liquid 12 and a low-temperature circulating liquid 22 flow. For the high-temperature circulating liquid 12 and the low-temperature circulating liquid 22, a fluid serving as a heat transfer medium for temperature adjustment such as a mixture of ethylene glycol and water is used. For example, a fluid called Galden or Fluorinert as product name can be used.

The chiller apparatus 3 has a high-temperature chiller 10 and a low-temperature chiller 20, changeover valves 61 and 62 serving as switching means, a main pump 70 and flow channels 51, 52 and 53.

The high-temperature chiller 3 includes a high-temperature tank 11, a heat exchanger 13 and a pump 14 for heat exchange. The pump 14 causes the high-temperature circulating liquid to circulate between the heat exchanger 13 and the high-temperature tank 11. The heat exchanger 13 and the pump 14 are controlled by a controller 40 serving as a control means. The controller 40 controls the heat exchanger 13 and the pump 14 so that the temperature of the high-temperature circulating liquid 12 in the high-temperature tank 11 is kept constantly to be a predetermined high temperature T3, 80° C., for example. This temperature T3 is set to be higher than a target temperature T2 of the silicon wafer 1 (T3>T2). With this setting, the high-temperature circulating liquid 12, temperature thereof being kept to be high temperature T3, which is higher than the target temperature T2 of the silicon wafer 1, is stored in the high-temperature tank 11.

In this regard, the target temperature T2 of the silicon wafer 1 shows its average temperature if an in-plane distribution exists. For example, if a target value T2_OUT of a zone temperature in an outer circumference region of the silicon wafer and a target value T2_Center of a zone temperature in a center region of the silicon wafer exist, their average value is the target temperature T2.

Meanwhile, the low-temperature chiller 20 includes a low-temperature tank 21, a heat exchanger 23 and a pump 24 for heat exchange. The pump 24 causes the low-temperature circulating liquid to circulate between the heat exchanger 23 and the low-temperature tank 21. The heat exchanger 23 and the pump 24 are controlled by the controller 40 serving as a control means. The controller 40 controls the heat exchanger 23 and the pump 24 so that the temperature of the low-temperature circulating liquid 22 in the low-temperature tank 21 is kept constantly to be a predetermined low temperature T1 (<T3), −10° C. for example. This temperature T1 is set to be lower than the target temperature T2 of the silicon wafer 1 (T1<T2). With this setting, the low-temperature circulating liquid 22, temperature thereof being kept to be low temperature T3, which is lower than the target temperature T2 of the silicon wafer 1, is stored in the low-temperature tank 21.

Heating capacity of the high-temperature chiller and cooling capacity of the low-temperature chiller are set to be greater than the heating capacity (or the heating capacity of the heater 33) and cooling capacity of thermoelectric elements 32 embedded in the stage 30.

Changeover valves 61 and 62 serving as a switching means are adapted to selectively switch between the low-temperature circulating liquid 22 in the low-temperature tank 21 and the high-temperature circulating liquid 12 in the high-temperature tank 11 to supply selected fluid to the inside-stage flow channel 31.

Specifically, a discharge opening 70a of the main pump 70 communicates with an inlet port 61a of the changeover valve 61 via a flow channel 53. Outlet ports 61b and 61c of the changeover valve 61 communicate with an inlet port 11a of the high-temperature tank 11 and an inlet port 21a of the low-temperature tank 21, respectively. Outlet port 11b of the high-temperature tank 11 and an outlet port 21b of the low-temperature tank 21 communicate with inlet ports 62a and 62b of the changeover valve 62, respectively. An outlet port 62c of the changeover valve 62 communicates with the inside-stage fluid channel 31 via the flow channel 51. The inside-stage flow channel 31 communicates with a suction opening 70b of the main pump 70 via the flow channel 52.

When the high-temperature circulating liquid 12 in the high-temperature tank 11 is to be selected and circulated, each of the changeover valves 61 and 62 is switched so that flows are generated from the inlet port 61a to one of the outlet ports 61b of the changeover valve 61, and from one of the inlet ports 62a to outlet port 62c of the changeover valve 62. With these operations, the high temperature fluid 12 in the high-temperature tank 11 is supplied to the inside-stage flow channel 31 via the flow channel 51, and returns again to the high-temperature tank 11 via the flow channel 52, the main pump 70, the flow channel 53, thereby to circulate within the flow channels 51, 31, 52 and 53.

On the other hand, when the low-temperature circulating liquid 22 in the low-temperature tank 21 is to be selected and circulated, each of the changeover valves 61 and 62 is switched so that flows are generated from the inlet port 61a to the other of the outlet ports 61c of the changeover valve 61, and from the other of the inlet ports 62b to outlet port 62c of the changeover valve 62. With these operations, the low temperature fluid 22 in the low-temperature tank 21 is supplied to the inside-stage flow channel 31 via the flow channel 51, and returns again to the low-temperature tank 21 via the flow channel 52, the main pump 70, the flow channel 53, thereby to circulate within the flow channels 51, 31, 52 and 53.

When the temperature of the silicon wafer is to be raised into the target temperature T2, the controller 40 serving as a control means switches so that the high-temperature circulating liquid 12 in the high-temperature tank 11 is supplied to the flow channel 31 inside the stage 30, and controls each of the thermoelectric elements 32 (or each of the thermoelectric elements 32 and the heaters 33) so that the temperature of the silicon wafer 1 coincides with the target temperature T2 and the in-plane temperature distribution of the silicon wafer 1 is a desired temperature distribution. Also, when the temperature of the silicon wafer is to be dropped into the target temperature T2, the controller 40 serving as a control means switches so that the low-temperature circulating liquid 22 in the low-temperature tank 21 is supplied to the flow channel 31 inside the stage 30, and controls each of the thermoelectric elements 32 (or each of the thermoelectric elements 32 and the heaters 33) so that the temperature of the silicon wafer 1 coincides with the target temperature T2 and the in-plane temperature distribution of the silicon wafer 1 is a desired temperature distribution.

Now, description will be made below while it is supposed that cooling by the thermoelectric elements 32 and heating by the thermoelectric elements 32 or by the heaters 33 are performed.

To begin with, a case will be described in which a control is performed through cooling and heating by solely the thermoelectric elements 32 with no operations of the heaters 33.

The description will be made in the reference to the flowchart shown in FIG. 2. It is supposed below that, for the symbols of temperature, the relation T1<T2<T3 is established.

Figure 2:
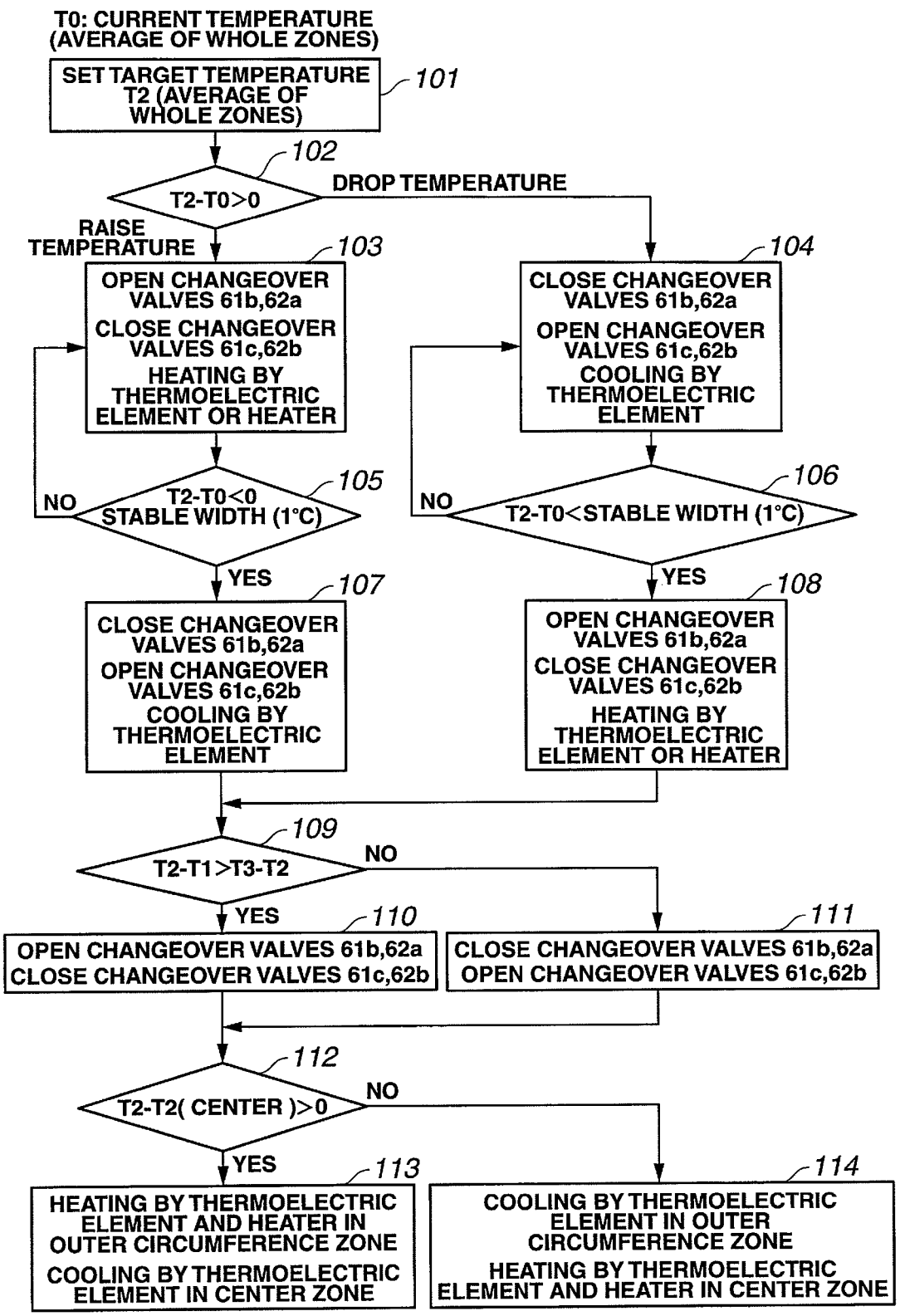
FIG. 2 illustrates a flowchart showing the processes of the exemplary embodiment of this invention.
Figure 3:
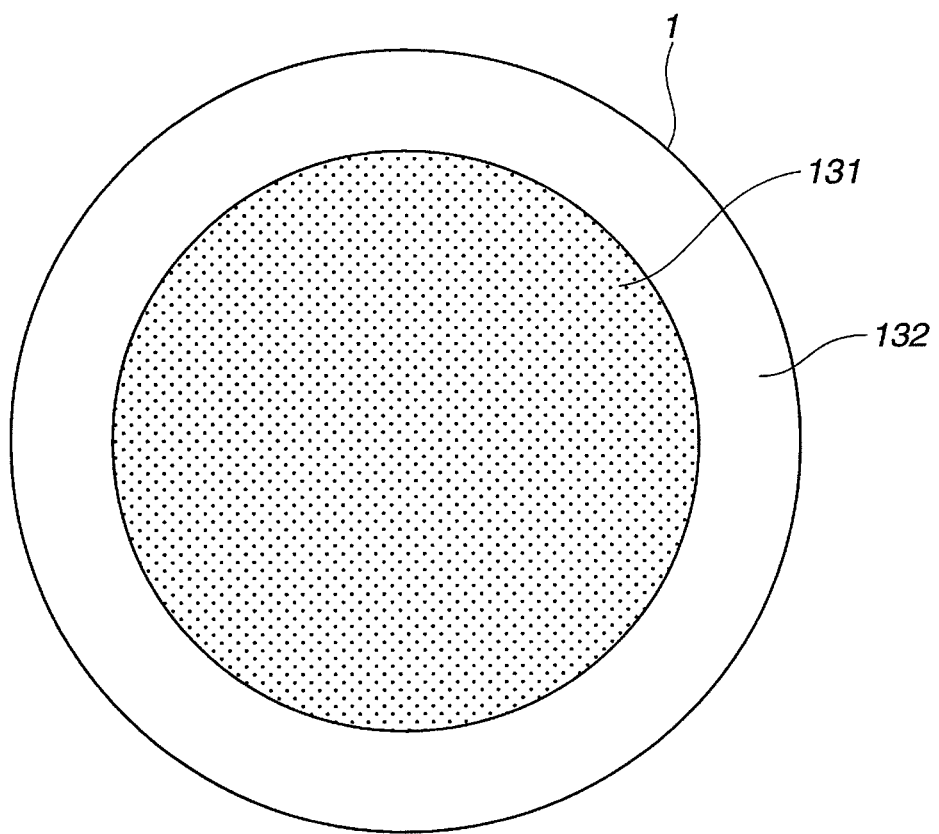
FIG. 3 illustrates a temperature distribution of a silicon wafer.

As shown in FIG. 2, at the controller 40, the target high temperature T2 or the target low temperature T2 is set, where the target temperature T2 is an average value over the whole zones 131, 132, 133 and so on if there are plural zones 131, 132, 133 and so on (step 101). Then, a current average temperature T0 is detected from sensors disposed each of the zones 131, 132, 133 and so on. T0 represents average of temperature of the silicon wafer 1.

The detected temperature T0 and the target temperature T2 (average value over the whole zones 131, 132, 133 and so on if there are plural zones 131, 132, 133 and so on) are compared to determine whether the temperature of the silicon wafer is to be raised or dropped (step 102).

If it is determined that the temperature of the silicon wafer is controlled to be raised into the target high temperature T2 (determination "raise temperature" at step 102), each of the changeover valves 61 and 62 is switched so that flows are generated from the inlet port 61a to one of the outlet ports 61b of the changeover valve 61, and from one of the inlet ports 62a to the outlet port 62c of the changeover valve 62. With this operation, the high temperature fluid 12 in the high-temperature tank 11 is supplied to the flow channel 31 inside the stage 30. At the same time, a control is performed to energize the plural thermoelectric elements 32 embedded inside each region of the stage 30 so that a heat generating action is performed at the upper surface of the stage 30 (step 103). With this operation, the upper surface of the stage 30 is swiftly heated, the temperature of silicon wafer 1 is swiftly raised into a stable value (step 105). If the difference T2−T0 between the target temperature T2 and current temperature T0 falls within the stable width (1° C., for example) (i.e., T2−T0<stable width (1° C.)) (YES at step 105), overshooting is prevented by switching the thermoelectric elements 32 to perform heat absorbing action (step 107). Specifically, when the upper surface of the stage 30 becomes a certain temperature or higher, the plural thermoelectric elements 32 are energized by supplying an electric current in the reverse direction to prevent the temperature of the silicon wafer from exceeding the target temperature T2. With this operation, heat absorbing action is performed at the upper surface of the stage 30 to cool down the upper surface of the stage 30 so that a temperature control of preventing the temperature of the silicon wafer from exceeding the target temperature T2 is performed (step 107).

Thereafter, a control is performed so that, in order for the temperature of the silicon wafer 1 to coincide with the target temperature T2, the plural thermoelectric elements 32 are energized to perform heat generating action or heat absorbing action at the upper surface of the stage 30. With this operation, the upper surface of the stage 30 is cooled or heated so that the temperature of the silicon wafer is retained to be the target temperature T2.

During a stable period, in order to decrease energy consumption, it is determined which of T1 or T3 the set temperature T2 is closer to (T2−T1>T3−T2) (step 109) and valve is opened or closed according to the determination to perform heating (step 110) or cooling (step 111).

The controller 40 compares, when an electric current is supplied to the thermoelectric elements 32 in the plural zones 131, 132, 133 and so on, the target temperature T2 with the center-region target temperature T2_Center (step 112), appropriately adjusts the direction and magnitude of an electric current to be flown through each of the thermoelectric elements 32, generates a desired in-plane temperature gradient to the silicon wafer 1 mounted on the stage 30, and makes the in-plane temperature distribution a desired temperature distribution.

Specifically, it is determined whether the central-zone target temperature T2_Center is lower than the target average temperature T2 (step 112), and if it is lower, the central zone (zone 133 in FIG. 4C, zone 135 in FIG. 4D) is cooled by the thermoelectric elements 32 and the outer circumference zone (zones 131 and 132 in FIG. 4C, zones 131, 132, 133 and 134 in FIG. 4D) is heated by the thermoelectric elements 32 (step 113).

Also, it is determined whether the central-zone target temperature T2_Center is lower than the target average temperature T2 (step 112), and if it is higher, the central zone is heated by the thermoelectric elements 32 and the outer circumference zone is cooled by the thermoelectric elements 32 (step 114).

As described above, the base temperature of the silicon wafer 1 is raised swiftly to the target temperature T2, and the in-plane temperature distribution of the silicon wafer 1 is caused to be a desired temperature distribution. In this case, a desired temperature distribution means a temperature distribution in which temperature in a zone at the central region is lower than temperature in a zone at the outer circumference region.

On the other hand, if it is determined that the temperature of the silicon wafer is controlled to be dropped into the target low temperature T2 (determination "drop temperature" at step 102), each of the changeover valves 61 and 62 is switched so that flows are generated from the inlet port 61a to the other of the outlet ports 61c of the changeover valve 61, and from the other of the inlet ports 62b to the outlet port 62c of the changeover valve 62. With this operation, the low temperature fluid 22 in the low-temperature tank 21 is supplied to the flow channel 31 inside the stage 30. At the same time, a control is performed to energize the plural thermoelectric elements 32 embedded inside each region of the stage 30 so that a heat absorbing action is performed at the upper surface of the stage 30 (step 104). With this operation, the upper surface of the stage 30 is swiftly cooled, the temperature of silicon wafer 1 is swiftly dropped into a stable value (step 106). If the difference T2−T0 between the target temperature T2 and current temperature T0 falls within the stable width (1° C., for example) (i.e., T2−T0<stable width (1° C.)) (YES at step 106), overshooting is prevented by switching the thermoelectric elements 32 to perform heat generating action (step 108). Specifically, when the upper surface of the stage 30 becomes a certain temperature or lower, the plural thermoelectric elements 32 are energized by supplying an electric current in the reverse direction to prevent the temperature of the silicon wafer from exceeding the target temperature T2. With this operation, heat generating action is performed at the upper surface of the stage 30 to heat up the upper surface of the stage 30 so that a temperature control of preventing the temperature of the silicon wafer from lowering the target temperature T2 is performed (step 108).

Thereafter, the same processes as described above are performed in steps 109 through 114.

In the foregoing description, a case was described in which a control is performed through cooling and heating by solely the thermoelectric elements 32 with no operations of the heaters 33. However, the heaters 33 may be operated instead of causing the thermoelectric elements 32 to perform heat generating action. In this case, corresponding zones are heated by operating the heaters 33 in place of the heat generating action by the thermoelectric elements 32 in steps 103, 108, 113 and 114 in FIG. 2.

Also, combination of heating by the thermoelectric elements 32 and heating by the heaters 33 may be employed. In this case, in steps 103, 108, 113 and 114 in FIG. 2, the heaters 33 are operated while the thermoelectric elements 32 perform heat generating action to heat the corresponding zones.

Incidentally, in the above-described control, in the case where heating and cooling are performed solely by the thermoelectric elements 32 with no operations of heaters 33, arrangement of the heaters 33 to be disposed in each of the zones 131, 132, 133 and so on can be omitted.

Next, referring to FIGS. 5 and 6, an example of apparatus so configured that the stage 30 is divided into four zones will be described.

Figure 5A:
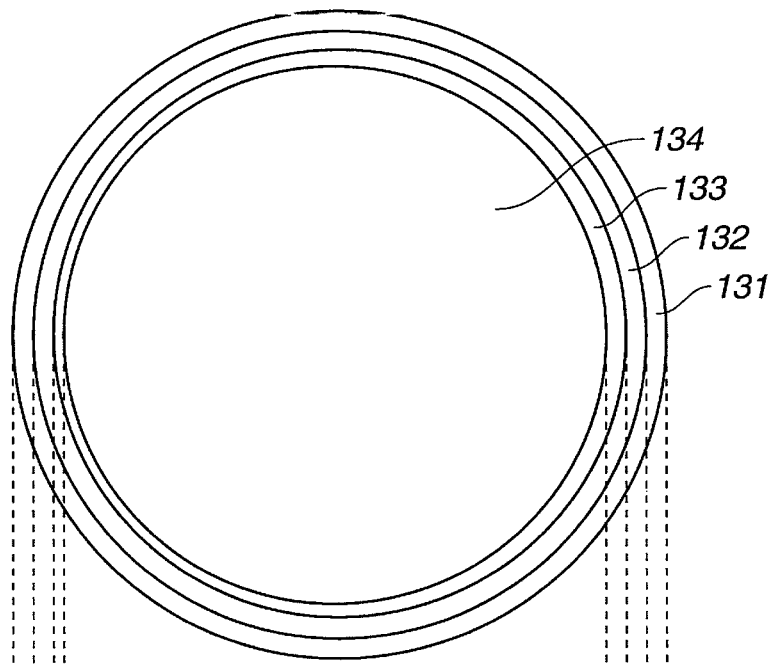
FIG. 5A illustrates the stage viewed from the top surface and FIG. 5B is a sectional view of the stage.

FIG. 5A is a drawing illustrating the stage 30 viewed from its upper surface, is a drawing illustrating cross section of the stage 30. Incidentally, In FIG. 5A, illustration of the silicon wafer (semiconductor wafer) 1 is omitted.

As shown in FIG. 5, the stage 30 comprises a top board 34 on which the silicon wafer 1 is to be mounted, a water-cooled board 35 formed with the inside-stage flow channel 31 through which the high-temperature circulating liquid 12 and the low-temperature circulating liquid 22 flow, and a group of the thermoelectric elements 32 interleaved between the top board 34 and the water-cooled board 35. Incidentally, Brine (trade name) may be used for the high-temperature circulating liquid 12 and the low-temperature circulating liquid 22.

For the group of the thermoelectric elements 32, the silicon wafer 1 is divided into four zones 131, 132, 133 and 134 by concentric circle lines. The zone 131 is an outermost circumference zone that corresponds to the most outer circumference, the zone 132 is a zone that is adjacent to an inner side of the outermost circumference zone 131 and a zone 133 is a zone that is adjacent to an inner side of the zone 132. The zone 134 is a zone that is adjacent to an inner side of the zone 133 and corresponds to an innermost (center region) zone. The zone 134 is formed in a concentric circle shape, and the zones 131, 132 and 133 are formed in an annular shape.

FIG. 6 is a drawing for illustrating a control to make the in-plane temperature distribution of the silicon wafer 1a desired temperature distribution. FIGS. 6A and 6B are drawings for illustrating a control to set a target value T2_Center of a zone temperature in a center region of the silicon wafer to be low and a value T2_OUT of a temperature in an outer circumference region to be high, so as to make a zone temperature in the center region low and a zone temperature in the outer circumference region high. FIG. 6A is an image drawing illustrating an image for a distribution of a surface temperature of the top board 34 (temperature of the silicon wafer 1), and FIG. 6B is a side view of the stage corresponding to FIG. 5B.

FIGS. 6C and 6D are drawings for illustrating a control to set a target value T2_Center of a zone temperature in a center region of the silicon wafer to be high and a value T2_OUT of a temperature in an outer circumference region to be low, so as to make a zone temperature in the center region high and a zone temperature in the outer circumference region low. FIGS. 6C and 6D are an image drawing for a temperature distribution and a side view of the stage corresponding to FIGS. 6A and 6B, respectively.

Control for a distribution in the plane of the silicon wafer 1 can be performed in the same process steps as described referring to FIG. 2. In FIG. 2, the processes in steps 101 through 111 are the same as in the foregoing description and therefore the description is omitted. Processes corresponding to steps 112 through 114 in FIG. 2 will be described hereinafter. In this example, the following steps 113 and 114 are performed in place of the steps 113 and 114 in FIG. 2.

(Control to be Performed to Effect a Temperature Distribution of the Silicon Wafer in which a Zone Temperature in the Center Region is Made Low and a Zone Temperature in the Outer Circumference Region is Made High; FIGS. 6A and 6B)

Now, control to be performed to effect a temperature distribution in which a zone temperature in the center region is made low and a zone temperature in the outer circumference region is made high is described. In this case, it is determined whether the central-zone target temperature T2_Center of the silicon wafer 1 is lower than the target average temperature T2 (average temperature in zones 131, 132, 133 and 134) (step 112), and if it is lower, or, in other words, if it is intended to obtain the temperature distribution shown in FIG. 6A, the thermoelectric elements 32 in the outermost circumference zone 131 are operated to cause them to perform the heat generating action, and the thermoelectric elements 32 in the zone 132 which is adjacent to an inner side of the outermost circumference zone 131 and in the zone 133 which is adjacent to an inner side of the zone 132 are operated to cause them to perform the heat absorbing action. Further, if there is a temperature difference ΔT between the target average temperature T2 and an actual average temperature T0, and the temperature difference ΔT (T2−T0) is a positive value so that heating is required to cause the actual average temperature to be the target average temperature T2, the thermoelectric elements 32 in the innermost (center region) zone 134 are operated to cause them to perform the heat generating action. On the other hand, if the temperature difference ΔT (T2−T0) is a negative value so that cooling is required to cause the actual average temperature to be the target average temperature T2, the thermoelectric elements 32 in the innermost (center region) zone 134 are operated to cause them to perform the heat absorbing action. (step 113)

(Control to be Performed to Effect a Temperature Distribution of the Silicon Wafer in which a Zone Temperature in the Center Region is Made High and a Zone Temperature in the Outer Circumference Region is Made Low; FIGS. 6C and 6D)

Now, control to be performed to effect a temperature distribution in which a zone temperature in the center region is made high and a zone temperature in the outer circumference region is made low is described. In this case, it is determined whether the central-zone target temperature T2_Center of the silicon wafer 1 is lower than the target average temperature T2 (average temperature in zones 131, 132 133 and 134) (step 112), and if it is higher, or, in other words, if it is intended to obtain the temperature distribution shown in FIG. 6C, the thermoelectric elements 32 in the outermost circumference zone 131 and in the zone 132 which is adjacent to an inner side of the outermost circumference zone 131 are operated to cause them to perform the heat absorbing action, and the thermoelectric elements 32 in the zone 133 which is adjacent to an inner side of the zone 132 which is adjacent to the inner side of the outermost circumference zone 131 are operated to cause them to perform the heat generating action. Further, if there is a temperature difference ΔT between the target average temperature T2 and an actual average temperature T0, and the temperature difference ΔT (T2−T0) is a positive value so that heating is required to cause the actual average temperature to be the target average temperature T2, the thermoelectric elements 32 in the innermost (center region) zone 134 are operated to cause them to perform the heat generating action. On the other hand, if the temperature difference ΔT (T2−T0) is a negative value so that cooling is required to cause the actual average temperature to be the target average temperature T2, the thermoelectric elements 32 in the innermost (center region) zone 134 are operated to cause them to perform the heat absorbing action. (step 114)

As described above, by heating or cooling the innermost (center region) zone among the four zones 131, 132, 133 and 134 in accordance with the temperature difference ΔT from the target temperature T2, and heating one zone and cooling two zones among the rest of the three zones 131, 132 and 133 at the outer circumference side, an in-plane temperature distribution having a temperature gradient between a zone temperature in the center region and a zone temperature in the outer circumference region can be obtained. This is achieved by utilizing the characteristics that a heating capacity is generally higher than a cooling capacity in the thermoelectric elements 32 (Peltier element). Dividing into four zones makes it possible to perform a zone control (heating, cooling) matched to the characteristics so that a desired in-plane temperature distribution can be obtained precisely.

Figure 5B:
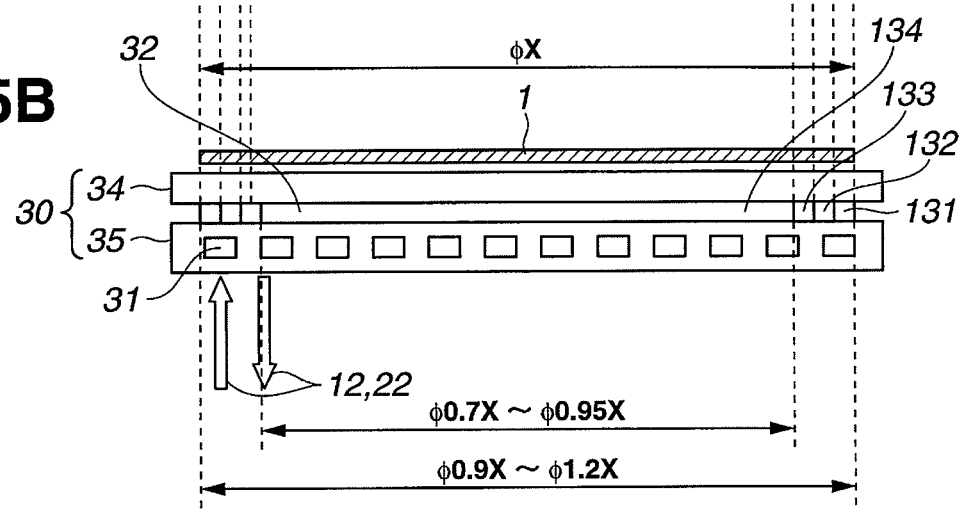

Incidentally, result of experiments shows that preferable ranges are, supposing that diameter of the silicon wafer 1 is X, 0.7X–0.95X for the diameter of the innermost zone 134 and 0.9X–1.2X for the diameter of the outermost zone 131 (the diameter of the whole zones) among the four divided zones (FIG. 5B).

According to each example described above, the following advantageous effect is obtained.

a) According to the present example, when the high-temperature circulating liquid 12 inside the high-temperature chiller 10 having a high temperature T3 which is higher than the target temperature T2 is supplied inside the stage 30, the thermoelectric elements 32 (or the heater 33 or the thermoelectric elements 32 and the heater 33) performs a heat generating action at the same time to heat the silicon wafer 1 on the stage 30. Also, when the low-temperature circulating liquid 22 inside the low-temperature chiller 20 having a low temperature T1 which is lower than the target temperature T2 is supplied inside the stage 30, the thermoelectric elements 32 performs a heat generating action at the same time to heat the silicon wafer 1 on the stage 30. Because of this, it becomes possible to raise or drop the base temperature of the silicon wafer 1 up or down to the target temperature T2 at a high speed so that manufacture time of semiconductor devices can be shortened.

b) According to the present example, since the stage 30 is divided into plural zones 131, 132, 133 and so on, and the thermoelectric elements 32 (or the thermoelectric elements 32 and the heater 33) disposed in each of the zones 131, 132, 133 and so on are individually controlled, each region of the top surface of the stage 30 can be adjusted to an arbitrary temperature more precisely and at an even higher speed. Because of this, the in-plane temperature distribution of the silicon wafer 1 can be made a desired temperature distribution (uniformizing the in-plane temperature and varying the in-plane temperature distribution by region) precisely. Thus, semiconductor devices can be manufactured at a high level of quality.

c) According to the present example, when the temperature of the silicon wafer 1 is to be raised, the high-temperature chiller 10 is operated and the thermoelectric elements 32 (or the heater 33 or the thermoelectric elements 32 and the heater 33) are operated with the thermoelectric elements 32 being operated for heat generation, and only when the temperature is to be fine-adjusted, the thermoelectric elements 32 is operated for heat absorption where necessary. Similarly, when the temperature of the silicon wafer 1 is to be dropped, the low-temperature chiller 20 is operated and the thermoelectric elements 32 are operated for heat absorption, and only when the temperature is to be fine-adjusted, the thermoelectric elements 32 (or the heater 33 or the thermoelectric elements 32 and the heater 33) are operated for heat generation where necessary. Because of this, wasteful consumption of heat energy is held down during heating or cooling, resulting in an excellent energy efficiency. Further, since heating and cooling are performed while heating capability of the thermoelectric elements 32 (or the heater 33) and cooling capability of the thermoelectric elements 32 are being added to heating capability and cooling capability of the chiller, capacity of the chiller can be made small, and therefore the apparatus can be of a simple construction.

d) Above all, according to the example in which the thermoelectric elements 32 in the stage 30 are divided into four zones 131, 132, 133 and 134 by concentric circle lines in the silicon wafer 1 and the thermoelectric elements 32 in these four zones 131, 132, 133 and 134 are independently controlled, in-plane temperature distribution can be obtained very precisely with a temperature gradient being provided between a zone temperature in the center region and a zone temperature in the outer circumference region of the silicon wafer 1. It becomes possible to set a temperature difference between the zone temperature T2_Center of the center region and the zone temperature T2_Out of the outer circumference region of the silicon wafer 1 to a range of 10° C. through 20° C.

Incidentally, in the present example, a case is described in which temperature of the silicon wafer 1 is controlled based on the detected temperature of the silicon wafer 1. However, ordinarily, the temperature of the silicon wafer 1 cannot be measured directly. Therefore, in an ordinary case, temperature of a region of the stage 30 which is adjacent to the silicon wafer 1 is measured as a substitute property and the control is performed.

The invention claimed is:

1. An apparatus for controlling a temperature of a semiconductor wafer mounted on a stage that controls the temperature of the semiconductor wafer so as to reach a target temperature and for controlling an in-plane temperature distribution of the semiconductor wafer so as to reach a desired temperature distribution, the apparatus comprising:
  a low-temperature tank that stores a circulating liquid which is kept to be a low temperature lower than the target temperature:
  a high-temperature tank that stores the circulating liquid which is kept to be a high temperature higher than the target temperature:
  a plurality of zones which are formed at each region in the stage and whose temperatures are capable of being adjusted independently, the plurality of zones being each provided with a thermoelectric element in accordance with the size of a semiconductor wafer:
  an inside-stage flow channel which is formed inside the stage and into which the circulating liquid flows:
  a switching unit that selectively switches between a low-temperature circulating liquid and a high-temperature circulating liquid to supply to the inside-stage flow channel;
  each of temperature sensors provided in each of the plurality of zones in the stage; and
  control means that when the temperature of the semiconductor wafer is controlled to be the target temperature by raising the temperature of the semiconductor wafer, performs switching so that the high-temperature circulating liquid in the high-temperature tank is supplied into the inside-stage flow channel, and based on temperature detected by each of the temperature sensors, adjusts each of the thermoelectric elements provided in each of the zones to control each of the temperatures in each of the zones so that the temperature of the semiconductor wafer coincides with the target temperature and the in-plane temperature distribution of the semiconductor wafer becomes the desired temperature distribution, and when the temperature of the semiconductor wafer is controlled to be the target temperature by dropping the temperature of the semiconductor wafer, performs switching so that the low-temperature circulating liquid in the low-temperature tank is supplied into the inside-stage flow channel, and based on temperature detected by each of the temperature sensors, adjusts each of the thermoelectric elements provided in each of the zones to control each of the temperatures in each of the zones so that the temperature of the semiconductor wafer coincides with the target temperature and the in-plane temperature distribution of the semiconductor wafer becomes the desired temperature distribution.

2. The apparatus for controlling a temperature of a semiconductor wafer according to claim 1, wherein
  the plurality of zones are each provided with a heater, and
  the control means, when the temperature of the semiconductor wafer is controlled to be the target temperature by raising the temperature of the semiconductor wafer performs switching so that the high-temperature circulating liquid in the high-temperature tank is supplied into the inside-stage flow channel, and controls the thermoelectric element and the heater so that the temperature of the semiconductor wafer coincides with the target temperature and the in-plane temperature distribution of the semiconductor wafer becomes the desired temperature distribution, and when the temperature of the semiconductor wafer is controlled to be the target temperature by dropping the temperature of the semiconductor wafer, performs switching so that the low-temperature circulating liquid in the low-temperature tank is supplied into the inside-stage flow channel, and controls the thermoelectric element and the heater so that the temperature of the semiconductor wafer coincides with the target temperature and the in-plane temperature distribution of the semiconductor wafer becomes the desired temperature distribution.

3. The apparatus for controlling a temperature of a semiconductor wafer according to claim 1, wherein
  the plurality of zones are formed by four zones by dividing the semiconductor wafer with concentric circle lines.

4. The apparatus for controlling a temperature of a semiconductor wafer according to claim 3, wherein
  the control means causes the thermoelectric element in an outermost circumference zone of the four zones to operate to perform a heat generating action, and causes the thermoelectric element in a zone inwardly adjacent to the outermost circumference zone and the thermoelectric element in a zone further inwardly adjacent to the zone which is inwardly adjacent to the outermost circumference zone to operate to perform a heat absorbing action.

5. The apparatus for controlling a temperature of a semiconductor wafer according to claim 3, wherein
the control means causes the thermoelectric element in an outermost circumference zone of the four zones and the thermoelectric element in a zone inwardly adjacent to the outermost circumference zone to operate to perform a heat absorbing action, and causes the thermoelectric element in a zone further inwardly adjacent to the zone which is inwardly adjacent to the outermost circumference zone to operate to perform a heat generating action.

6. A method for controlling a temperature of a semiconductor wafer mounted on a stage that controls the temperature of the semiconductor wafer so as to reach a target temperature and for controlling an in-plane temperature distribution of the semiconductor wafer so as to reach a desired temperature distribution, the method comprising the steps of:
performing switching so that a high-temperature circulating liquid is supplied into an inside-stage flow channel, and based on a temperature detected by each of temperature sensors provided in each of plurality of zones in accordance with the size of a semiconductor wafer, adjusting each of thermoelectric elements provided in each of the zones to control each of the temperatures in each of the zones so that the temperature of the semiconductor wafer coincides with the target temperature and the in-plane temperature distribution of the semiconductor wafer becomes the desired temperature distribution, when the temperature of the semiconductor wafer is controlled to be the target temperature by raising the temperature of the semiconductor wafer, and
performing switching so that a low-temperature circulating liquid is supplied into the inside-stage flow channel, and based on a temperature detected by each of the temperature sensors provided in each of the zones of the plurality of zones in accordance with the size of the semiconductor wafer, adjusting each of thermoelectric elements provided in each of the zones to control each of the temperatures in each of the zones so that the temperature of the semiconductor wafer coincides with the target temperature and the in-plane temperature distribution of the semiconductor wafer becomes the desired temperature distribution, when the temperature of the semiconductor wafer is controlled to be the target temperature by dropping the temperature of the semiconductor wafer.

7. The method for controlling a temperature of a semiconductor wafer according to claim 6, wherein
switching is performed so that the high-temperature circulating liquid is supplied into the inside-stage flow channel, and the thermoelectric element and a heater are controlled so that the temperature of the semiconductor wafer coincides with the target temperature and the in-plane temperature distribution or the semiconductor wafer becomes the desired temperature distribution, when the temperature of the semiconductor wafer is controlled to be the target temperature by raising the temperature of the semiconductor wafer, and
switching is performed so that the low-temperature circulating liquid is supplied into the inside-stage flow channel, and the thermoelectric element and the heater are controlled so that the temperature of the semiconductor wafer coincides with the target temperature and the in-plane temperature distribution of the semiconductor wafer becomes the desired temperature distribution, when the temperature of the semiconductor wafer is controlled to he the target temperature by dropping the temperature of the semiconductor wafer.

8. The method for controlling a temperature of a semiconductor wafer according to claim 6, wherein
the plurality of zones are formed by four zones by dividing the semiconductor wafer with concentric circle lines.

9. The method for controlling a temperature of a semiconductor wafer according to claim 8, wherein
the thermoelectric element in an outermost circumference zone of the four zones is caused to operate to perform a heat generating action, and the thermoelectric element in a zone inwardly adjacent to the outermost circumference zone and the thermoelectric element in a zone further inwardly adjacent to the zone which is inwardly adjacent to the outermost circumference zone are caused to operate to perform a heat absorbing action.

10. The method for controlling a temperature of a semiconductor wafer according to claim 8, wherein
the thermoelectric element in an outermost circumference zone of the four zones and the thermoelectric element in a zone inwardly adjacent to the outermost circumference zone are caused to operate to perform a heat absorbing action, and the thermoelectric element in a zone further inwardly adjacent to the zone which is inwardly adjacent to the outermost circumference zone is caused to operate to perform a heat generating action.

* * * * *